United States Patent
Choi et al.

(10) Patent No.: US 6,524,868 B2
(45) Date of Patent: Feb. 25, 2003

(54) METHOD FOR FABRICATING SEMICONDUCTOR MEMORY DEVICE

(75) Inventors: Eun-Seok Choi, Ichon-shi (KR); Seung-Jin Yeom, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/892,537

(22) Filed: Jun. 28, 2001

(65) Prior Publication Data

US 2002/0000594 A1 Jan. 3, 2002

(30) Foreign Application Priority Data

Jun. 30, 2000 (KR) .......................... 2000-37353

(51) Int. Cl.⁷ .............................................. H01L 21/00
(52) U.S. Cl. ........................ 438/3; 438/238; 438/386; 438/387; 438/396; 257/68; 257/71; 257/295; 257/296
(58) Field of Search .................... 438/3, 253, 240, 438/238, 239, 242, 243, 250, 386, 387, 393, 396; 257/295–313, 753, 783, 68, 71

(56) References Cited

U.S. PATENT DOCUMENTS 5,418,388 A * 5/1995 Okudaira et al. ............ 257/295
6,210,979 B1 * 4/2001 Kweon et al. ............... 438/253
6,225,156 B1 * 5/2001 Cuchiaro et al. ........... 438/240
6,239,462 B1 * 5/2001 Nakao et al. ................ 257/295

FOREIGN PATENT DOCUMENTS

FR  0008955  * 7/1997  ......... H01L/21/316

* cited by examiner

Primary Examiner—David Nelms
Assistant Examiner—Long Tran
(74) Attorney, Agent, or Firm—Jacobson Holman PLLC

(57) ABSTRACT

A semiconductor memory device is provided which prevents a lifting phenomenon by improving an adhesive strength between an upper electrode and an interlayer insulating layer. The semiconductor memory device includes a capacitor formed on a semiconductor substrate, wherein the capacitor includes a lower electrode, a dielectric layer and an upper electrode; an adhesion layer formed on the upper electrode; an interlayer insulating layer covering the capacitor, wherein a portion of the interlayer insulating layer is in contact with the adhesion layer; and a contact hole, formed within the interlayer insulating layer, whose bottom exposes the upper electrode and whose sidewalls expose the interlayer insulating layer and the adhesion layer.

5 Claims, 2 Drawing Sheets

METHOD FOR FABRICATING SEMICONDUCTOR MEMORY DEVICE

FIELD OF THE INVENTION

The present invention relates to a semiconductor memory device and, more particularly, to a method for fabricating a semiconductor memory device, in which a lifting phenomenon is prevented by improving an adhesive strength between an upper electrode and an interlayer insulating layer.

DESCRIPTION OF THE PRIOR ART

With the recent progress in film deposition techniques, applications of a nonvolatile memory cell using a ferroelectric thin film have increasingly been developed. This nonvolatile memory cell is a high-speed rewritable nonvolatile memory cell utilizing the high-speed polarization/inversion and the residual polarization of the ferroelectric capacitor thin film.

Therefore, a ferroelectric random access memory (FeRAM) where a capacitor thin film with ferroelectric properties such as strontium bismuth tantalate (SBT) and lead zirconate titanate (PZT) is increasingly used for a capacitor, because it assures a low-voltage and high-speed performance, and does not require periodic refresh to prevent loss of information during standby intervals like a dynamic random access memory (DRAM).

Since a ferroelectric material has a dielectric constant ranging from a value of hundreds to thousands and a stabilized residual polarization property at room temperature, it is being applied to the non-volatile memory device as the capacitor thin film. When employing the ferroelectric capacitor thin film in the non-volatile memory device, information data are stored by polarization of dipoles when electric field is applied thereto. Even if the electric field is removed, the residual polarization still remains so that the information data, i.e., "0" or "1", can be stored.

In fabricating a ferroelectric capacitor, a high-temperature thermal treatment is carried out so that a lower/upper electrode is formed using Pt, Ir, Ru, their oxides or a combination thereof. However, since these materials have poor adhesive characteristics, a lifting phenomenon occurs during a following thermal treatment. The lifting phenomenon can be prevented by forming an adhesion layer between a lower electrode and an interlayer insulating layer.

Meanwhile, there is no adhesion layer between an upper electrode and an interlayer insulating layer covering the upper electrode. As a result, during a cleaning process after a formation of a contact hole exposing the upper electrode, a cleaning solution soaks into a boundary between the upper electrode and the interlayer insulating layer, so that a lifting phenomenon results.

SUMMARY OF THE INVENTION

It is, therefore, an object of the present invention to provide a method for fabricating a semiconductor memory device, in which the occurrence of a lifting phenomenon is prevented by improving an adhesive strength between an upper electrode and an interlayer insulating layer.

In accordance with an aspect of the present invention, there is provided a semiconductor memory device, comprising a capacitor formed on a semiconductor substrate, wherein the capacitor includes a lower electrode, a dielectric layer and an upper electrode; an adhesion layer formed on the upper electrode; an interlayer insulating layer covering the capacitor, wherein a portion of the interlayer insulating layer is in contact with the adhesion layer; a contact hole, formed within the interlayer insulating layer, whose bottom exposes the upper electrode and whose sidewalls expose the interlayer insulating layer and the adhesion layer; and an interconnection line coupled to the capacitor via the contact hole.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

FIGS. 1 to 4 are cross-sectional views illustrating sequential steps of a FeRAM in accordance with the present invention.

Figure 1:
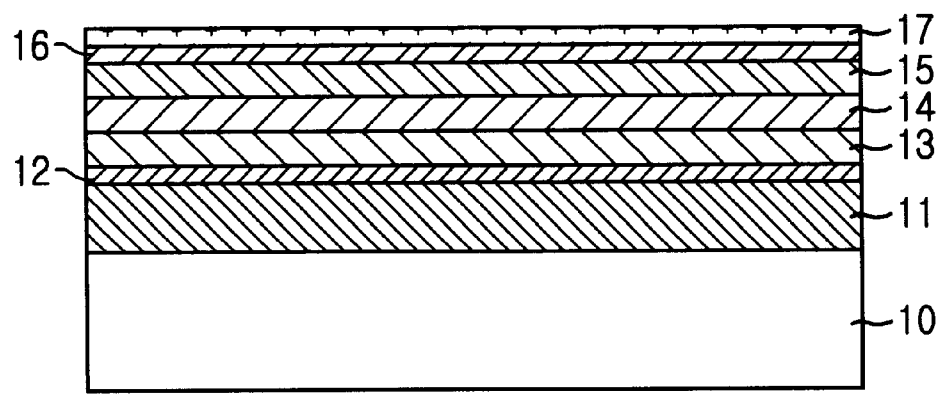
FIGS. 1 to 4 are cross-sectional views illustrating sequential steps of a FeRAM in accordance with the present invention.

Referring to FIG. 1, an interlayer insulating layer 11 is formed on a semiconductor structure 10 that includes transistors formed on the semiconductor substrate 10. Then, a lower adhesion layer 12, a lower electrode layer 13, a ferroelectric layer 14, an upper electrode layer 15, an upper adhesion layer 16 and a hard mask layer 17 are sequentially formed on the interlayer insulating layer 11.

At this time, the upper adhesion layer 16 can be formed with material such as Ti, Ta, Zr, Hf or the like, which acquires adhesion characteristic by oxidation of the materials during a thermal treatment for recovering a ferroelectric characteristic. The upper adhesion layer 16 can be also formed with $TiO_2$, $Ta_2O_5$, $ZrO_2$, $HfO_2$, or the like.

The upper adhesion layer 16 is formed by using several methods such as physical vapor deposition (PVD), a chemical vapor deposition (CVD), an atomic layer deposition (ALD) and an electrochemical deposition (ECD). It is preferable to form the upper adhesion layer 16 to a thickness of 50 Å to 500 Å. Meanwhile, the upper electrode layer 15 can be formed with Pt, Ir, Ru, their oxides, or a combination thereof, and the hard mask layer 17 can be formed with TiN, TaN or WN.

Figure 2:
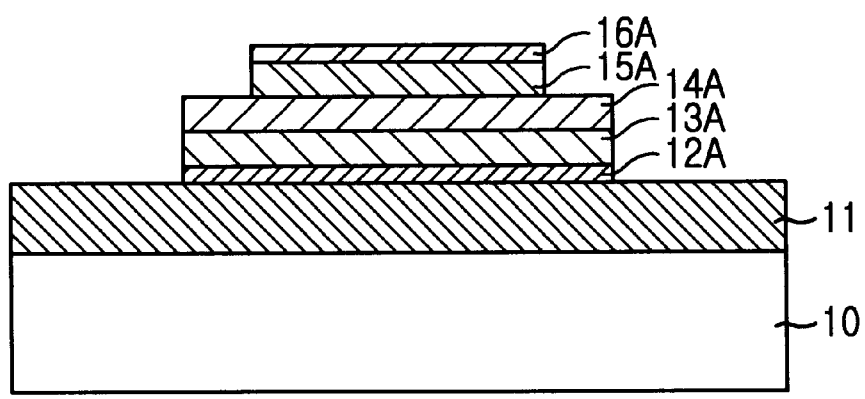

Referring to FIG. 2, the hard mask layer 17 is patterned to form a patterned hard mask layer (not shown), and the upper electrode layer 15 is etched by using the patterned hard mask layer as an etching mask to thereby form an upper electrode pattern 15A. Then, the patterned hard mask layer is removed to expose the upper adhesion layer 16A. Thereafter, the ferroelectric layer 14 and the lower electrode layer 13 are patterned to form a patterned ferroelectric layer 14A and a patterned lower electrode layer 13A.

Figure 3:
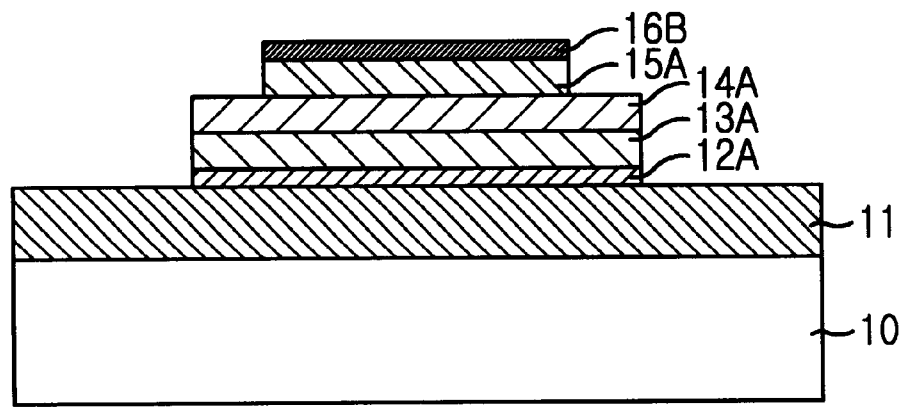

Referring to FIG. 3, a thermal treatment for recovering a degraded ferroelectric characteristic is carried out. At this time, the upper adhesion layer 16A is oxidized to thereby form an adhesive oxide layer 16B. The thermal treatment is carried out at an oxygen atmosphere under a temperature of 300° C. to 1000° C. Preferably, before or after the thermal treatment, a plasma process, an ozone process or a rapid thermal process can be carried out in order to enhance the oxidation.

Figure 4:
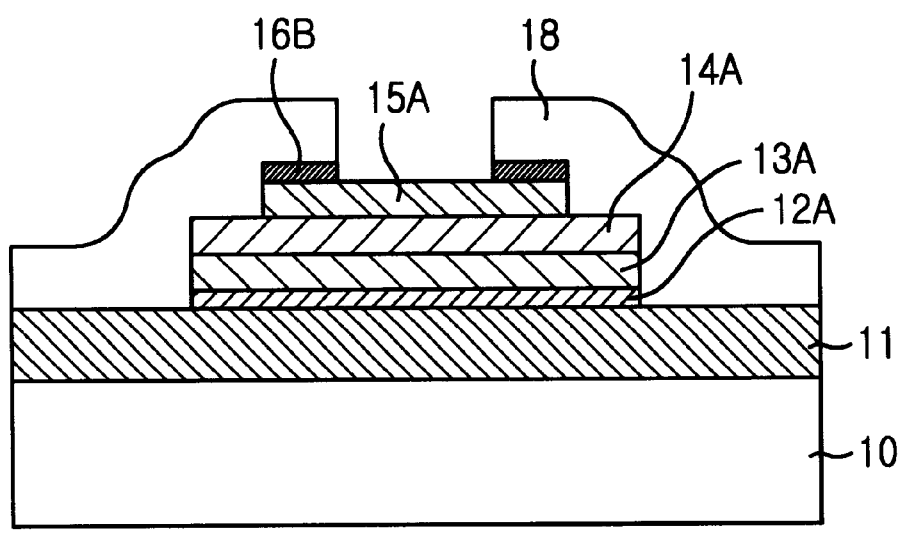

Referring to FIG. 4, an interlayer insulating layer 18 is formed on the entire structure. Then, the interlayer insulating layer 18 and the adhesive oxide layer 16B are selectively etched to form a contact hole, whose bottom exposes the upper electrode layer 15A and whose sidewalls expose the interlayer insulating 18 and the adhesive oxide layer 16B.

The foregoing procedure may be performed by using a typical method for fabricating the FeRAM.

Since the FeRAM in accordance with the present invention has an adhesion layer between the upper electrode and the interlayer insulating layer, a cleaning solution does not soak into a boundary between the upper electrode and the interlayer insulating layer so that a lifting phenomenon is prevented. Additionally, since it is possible to perform a cleaning process by using a strong cleaning solution, a low contact resistance can be obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor memory device, comprising steps of:
    a) forming a capacitor by stacking a capacitor by stacking a lower electrode, a dielectric layer and an upper electrode on a semiconductor substrate;
    b) forming an adhesion layer on the upper electrode by a deposition method;
    c) forming a hard mask on the adhesion layer;
    d) etching the adhesion layer and the upper electrode by using the hard mask layer as an etching mask;
    e) removing the hard mask layer to expose the adhesion layer;
    f) patterning the dielectric layer and the lower electrode;
    g) forming an interlayer insulating layer on an entire structure to bring a portion of the interlayer insulating layer into contact with the adhesion layer; and
    h) selectively etching the interlayer insulating layer and the adhesion layer to form a contact hole, a bottom of said contact hole exposing the upper electrode and sidewalls of said contact hole exposing the interlayer insulating layer and the adhesion layer;
       wherein the adhesion layer is formed with a material selected from the group consisting of $Ta_2O_5$, $ZrO_2$ and $HfO_2$.

2. The method as recited in claim 1, wherein the dielectric layer is a ferroelectric layer.

3. The method as recited in claim 2, further comprising after the step f), a step of carrying out a thermal treatment at an oxygen atmosphere.

4. The method as recited in claim 1, further comprising after the f), a step of carrying out one of a rapid thermal process, a plasma process and an ozone process.

5. The method as recited in claim 1, wherein the deposition method is one selected from the group consisting of a physical vapor deposition, a chemical vapor deposition, an atomic layer deposition and an electrochemical deposition.

* * * * *